US006400775B1

United States Patent
Gourgue et al.

(10) Patent No.: US 6,400,775 B1
(45) Date of Patent: Jun. 4, 2002

(54) METHOD AND A SYSTEM FOR DIGITALLY LINEARIZING AN AMPLIFIER

(75) Inventors: Frédéric Gourgue; Véronique Soula, both of Paris (FR)

(73) Assignee: Alcatel, Paris (FR)

(*) Notice: Subject to any disclaimer, the term of this patent is extended or adjusted under 35 U.S.C. 154(b) by 0 days.

(21) Appl. No.: 09/226,911

(22) Filed: Jan. 5, 1999

(30) Foreign Application Priority Data

Jan. 6, 1998 (FR) .......................................... 98 00041

(51) Int. Cl.$^7$ ................................................. H03F 1/26
(52) U.S. Cl. ............................ 375/296; 375/224; 330/2; 330/149
(58) Field of Search ............................... 375/296, 224, 375/227, 297, 295, 285, 222; 330/149, 2; 455/68, 69; 457/70

(56) References Cited

U.S. PATENT DOCUMENTS

| | | | |
|---|---|---|---|
| 4,291,277 A | 9/1981 | Davis et al. ................ 330/149 |
| 4,700,151 A | 10/1987 | Nagata ........................ 332/18 |
| 4,967,164 A | 10/1990 | Sari ............................ 330/149 |
| 5,113,414 A | 5/1992 | Karam et al. ................. 375/60 |
| 5,148,448 A | 9/1992 | Karam et al. ................. 375/60 |
| 5,404,378 A | * 4/1995 | Kimura ........................ 375/296 |
| 5,574,992 A | 11/1996 | Cygan et al. ............... 455/126 |
| 5,867,065 A | * 2/1999 | Leyendecker .............. 330/149 |
| 5,910,965 A | * 6/1999 | Ierfino et al. ............... 375/220 |
| 6,072,364 A | * 6/2000 | Jeckeln et al. .............. 330/149 |
| 6,081,158 A | * 6/2000 | Twitchell et al. ........... 330/149 |
| 6,212,229 B1 | * 4/2001 | Salinger ..................... 375/224 |

FOREIGN PATENT DOCUMENTS

GB 2 283 629 A 5/1995

OTHER PUBLICATIONS

Cacopardi et al., "Digital Linearizer for RF Amplifiers", IEEE Transactions on Broadcasting, vol. 43, No. 1, pp. 12–19, Mar. 1997.*
Reggiannini et al., "A Digital Approach to Efficient RF Power Amplifier Linearization", Global Telecommunication Conference, 1997, Globecom 97, IEEE, vol. 1, pp. 77–81.*
De Mingo et al., "Performance of a Digital Base–Band Pre–Distorting Amplifier Linearizer Implemented in Fixed Points DSPs", Mediterranean Electrotechnical Conference 1998, Melecon 98, 9th, vol. 1, pp. 522–526, 1998.*
G. Karam et al, Generalized Data Predistortioning Intersymbold Interpolation, Philips Journal of Research, vol. 46, No. 1, Jan. 1, 1991, pp. 1–21.
G. Karam et al, Data Predistortion Techniques using Intersymbol Interpolation, IEEE Transactions on Communications, vol. 38, No. 10, Oct. 1, 1990, pp. 1716–1723.

* cited by examiner

*Primary Examiner*—Chi Pham
*Assistant Examiner*—Dung X. Nguyen
(74) *Attorney, Agent, or Firm*—Sughrue Mion, PLLC

(57) ABSTRACT

The invention relates to a method of digitally linearizing an amplifier having non-linearity, the method being of the type comprising: a prior stage in which correction parameters for correcting said non-linearity are determined, and a linear amplification stage performed by applying predistortion followed by amplification. In the invention, stage in which the correction parameters are determined comprises the following steps: acquiring said amplified test signal in the form of samples in baseband; defining a modelled amplifier, by computing parameters of a predetermined amplifier model on the basis of said samples of the amplified test signal; and computing said correction parameters on the basis of said modelled amplifier so that they make it possible to linearize said modelled amplifier. The invention also relates to a corresponding system for digitally linearizing an amplifier.

11 Claims, 3 Drawing Sheets

METHOD AND A SYSTEM FOR DIGITALLY LINEARIZING AN AMPLIFIER

The invention relates to the field of amplifiers.

More precisely, the invention relates to a method and a system for linearizing an amplifier.

BACKGROUND OF THE INVENTION

The invention is particularly, but not exclusively, applicable to linearizing amplifiers used in cellular radiocommunications systems (such as, in particular, the Global System for Mobile communications 900 MHz (GSM 900) (a public radiccommunications system operating in the 900 MHz band), the Digital Cellular System 1800 MHz (DCS 1800), the Personal Communication System (PCS), IS95, the Universal Mobile Telephone System (UMTS), the International Mobile Telecommunications 2000 system (IMT-2000), CDMA-One, etc.

A mobile terminal generally includes an amplifier in its transmission system.

Frequently, it is desirable to obtain linear amplification. Since an amplifier is never exactly linear, it is necessary to linearize the amplifier.

In radiocommunications systems, the non-linearity of the amplifier in the radio transmission system is detrimental because it distorts the transmitted signal, thereby degrading the spectrum of the signal, and thus causing interference signals to be generated in channels adjacent to the working channel. In other words, the non-linearity of the amplifier causes an increase in the level of transmission interference in the adjacent channels. This gives rise to failure to comply with specifications aiming to limit interference. Such failure to comply with the specifications is further accentuated when modulation having a non-constant envelope (which is more sensitive to non-linearity defects) is used upstream from the amplifier. It can thus be understood that it is necessary to linearize the amplifier.

Several solutions for performing such linearization are known from the state of the art.

A first known linearization solution consists in using the amplifier well within its capacities, so as to operate in a linear zone. The lower the power level, the smaller the non-linearity manifested by the amplifier. That first known solution suffers from the major drawback of degrading amplifier efficiency. Thus, if such an amplifier is included in a mobile terminal, it reduces battery life between charges.

A second known linearization solution consists in using an analog feedback correction loop (cf FIG. 1). Unfortunately, the correction loop requires additional analog components which firstly suffer from defects affecting the performance of the resulting overall system, and secondly are subjected to drift over time, causing the effectiveness of the correction to vary.

A third known linearization solution consists in using an analog feedforward correction loop (cf FIG. 2). The drawback with such a correction loop is that it requires a second amplifier which must be very linear.

A fourth known linearization solution is described in Patent Document EP 522 706 A2. That document describes a linearization method comprising a prior testing stage and an amplification stage. During the prior testing stage, the following are performed successively: a test signal is amplified; the corresponding output signal is sampled at a low rate over a long period; the Fourier transform is applied to the samples of the amplified test signal; the amplitudes of the harmonics are computed so as to reconstruct the output signal; the input signal is compared with the reconstructed output signal of the amplifier, so as to determine the distortion parameters specific to the amplifier, and a table is constructed of predistortion parameters which are such that they cancel the distortion parameters specific to the amplifier. During the amplification stage, the predistortion parameters are applied to the signal to be amplified, so that the amplified signal at the output of the amplifier is not distorted.

In other words, in the fourth solution, the principle of predistortion is used which consists in compensating for the non-linearity of the amplifier by adding a unit of inverse non-linearity at the input of the amplifier, so that the juxtaposition of the two non-linear units has a linear transfer function. The test stage which, in the fourth solution, consists in comparing the input test signal with the corresponding output signal, makes it possible to determine the distortion (or non-linearity) due to the amplifier.

The fourth known solution is not advantageous because it requires many samples to be taken at the output of the amplifier, and therefore requires a large amount of computation, considerable memory space, and a long time for acquiring (i.e. recovering) and processing the samples at the output of the amplifier. In addition, the results obtained are not accurate. It should be noted that a long acquisition time can be incompatible with certain operational constraints allowing only a small amount of time for acquisition: signals that are not steady, or time limits for transmission of test signals).

To sum up, it appears that all of the above-mentioned known solutions which aim to enable an amplifier to be linearized suffer from drawbacks, namely, in particular, their high cost considering the performance obtained.

OBJECTS AND SUMMARY OF THE INVENTION

A particular object of the present invention is to mitigate the various drawbacks of the state of the art.

More precisely, one of the objects of the present invention is to provide a method and a system of digitally linearizing an amplifier, the method and system requiring lower computation power than the above-mentioned known solutions.

An additional object if to provide such a method and such a system that require only a small amount of memory space.

Another object of the invention is to provide such a method and such a system that make it possible to reduce the time required to acquire the samples at the output of the amplifier, as compared with the solutions known from the state of the art.

Another object of the invention is to provide such a method and such a system that make it possible to reduce the time required to process the output samples, as compared with the solutions known from the state of the art.

A further object of the invention is to provide such a method and such a system that make it possible to obtain results that are very accurate.

Another object of the invention is to provide such a method and such a system that are low in cost.

These various objects and others that appear below are achieved by the invention by means of a method of digitally linearizing an amplifier having non-linearity, the method being of the type comprising:

a prior determination stage in which correction parameters for correcting said non-linearity are determined, as a function of an amplified test signal present at the output of the amplifier when a test signal is applied to the input thereof; and a linear amplification stage comprising the following steps:

causing an input signal which is to be amplified by said amplifier to be predistorted as a function of said correction parameters so as to obtain a predistorted signal; and causing said predistorted signal to be amplified by said amplifier so that the amplified predistorted signal present at the output of said amplifier corresponds to said input signal as amplified linearly;

wherein said determination stage in which the correction parameters are determined comprises the following steps:

acquiring said amplified test signal in the form of samples in baseband;

defining a modelled amplifier, by computing parameters of a predetermined amplifier model on the basis of said samples of the amplified test signal; and computing said correction parameters on the basis of said modelled amplifier so that they make it possible to linearize said modelled amplifier.

The present invention thus provides a novel way of determining the predistortion relationship (i.e. the correction parameters) to be applied upstream from the amplifier in order, ultimately, to obtain amplification that is linear.

More precisely, the general principle of the invention consists in modelling the real amplifier, and then in computing the predistortion relationship on the basis of the modelled amplifier (and not on the basis of the real amplifier) in order to compensate for its non-linearity.

In other words, the work is done on a model of the amplifier and not, as in above-mentioned Patent Document EP 522 706 A2, merely on a comparison between the input test signal and the corresponding output signal (i.e. the amplified test signal). It is important to note that the fact that a modelled amplifier is used makes it possible to obtain improved accuracy on the correction parameters to be applied to the input signal, and thus improved linearization of the amplifier. In general, the closer the modelled amplifier is to the real amplifier, the better the resulting linearization.

It is recalled that, when applied to a mobile terminal, the linearization method of the invention makes it possible to limit interference between channels. Clearly, however, the method of the invention is not limited to being applied to the case when the amplifier is incorporated in a mobile terminal, but rather it can be considered regardless of the use of the amplifier.

Advantageously, said step in which the modelled amplifier is defined comprises the following steps:

performing spectrum analysis on said amplified test signals to estimate the complex amplitudes of a predetermined number of harmonics at known frequencies, said harmonics being generated by said non-linearity of the amplifier; and computing the parameters of the predetermined amplifier model by identifying firstly the estimated complex amplitudes and secondly mathematical expressions corresponding to complex amplitudes of harmonics at said known frequencies for a signal present at the output of the modelled amplifier, said mathematical expressions being computed on the basis of said predetermined amplifier model, by assuming that the test signal is applied to the input thereof.

Estimating the complex amplitudes of certain cross-modulation harmonics makes it possible to characterize the amplitude-amplitude (AM-AM) and amplitude-phase (AM-PM) non-linearities of the amplifier.

In addition, since a limit is set at a predetermined number of harmonics whose frequencies are known, the time taken to acquire the samples of the amplified test signal can be short.

Preferably, said spectrum analysis performed on the samples of the amplified test signal belongs to the group comprising:

parametric spectrum analyses; and spectrum analyses by sampling followed by a Fourier transform.

It should be noted that parametric spectrum analysis offers the advantage of requiring fewer calculations, and less memory space, and of requiring a shorter sample input time. In addition, it is possible to simplify this type of analysis considerably insofar as firstly the waveform of the signal is known (superposition of a plurality of sinewaves), and secondly the frequencies of the spectrum lines (or harmonics) whose amplitudes are to be determined are known.

In a preferred implementation of the invention, said step in which the complex amplitudes of harmonics are estimated consists in computing:

$$\vec{H} = M\,S$$

where $H = [H_1 H_2 \ldots H_p]^T$ is the vector of the complex amplitudes of p harmonics in question;

$S = [s_0\ s_1\ \ldots\ s_N]^T$ is the vector of N samples of the amplified test signal; and M is a predetermined matrix (p,N).

In this way, the vector H can be computed very rapidly. The matrix M, which depends only on the frequencies of the harmonics that are to be characterized, is entirely known, and can be computed once and for all and stored in a memory. N is also referred to as the "sampling window".

Advantageously, said matrix M can be written:

$$M = ([Z^H Z]^{-1} Z^H)$$

where $Z^H$ is the Hermitian transpose of Z;

$z_i = \exp(2j\pi f_i)$, $f_i$ being the frequency of the $i^{th}$ harmonic in question; and $$Z = \begin{bmatrix} 1 & 1 & \cdots & 1 \\ z_1 & z_2 & \cdots & z_p \\ \vdots & \vdots & \cdots & \vdots \\ z_1^{N-1} & z_2^{N-1} & \cdots & z_p^{N-1} \end{bmatrix}$$

In a preferred implementation of the invention, said predetermined amplifier model is a polynomial model.

Clearly, the higher the degree of the polynomial that models the amplifier, the greater the accuracy of the modelled amplifier. The transfer function modelling the amplifier (voltage/voltage transfer function) may be given in RF by a polynomial, it nevertheless being possible to determine the complex coefficients of such a polynomial in baseband.

Preferably, said polynomial model is of odd order and does not take account of the even-order terms.

It is possible to take no account of even-order terms since they do not generate harmonics in the band of the high-frequency signal.

Preferably, said polynomial may be written $y=x \cdot G_a$ in baseband, where:

the input may be written $x=x_i+j \cdot x_q$ the output may be written $y=y_i+j \cdot y_q$ $$G_a(P_x)=a_1+(3/4) \cdot a_3 \cdot (P_x)+(5/8) \cdot a_5 \cdot (P_x)^2+(35/64) \cdot a_7 \cdot (P_x)^3+\ldots$$

where:

$P_x=x_i^2+x_q^2$ $a_i=a_i \cdot e^{-j\omega\tau_i}$ $x_i$ and $x_q$ are respectively the in-phase component and the quadrature component of x;

$y_i$ and $y_q$ are respectively the in-phase component and the quadrature component of y; and the coefficients $a_i$ and the associated delays $\tau_i$ are parameters of said predetermined amplifier model.

Going over to baseband makes it possible to facilitate computation of the parameters characterizing the modelled amplifier.

Preferably, said test signal is a signal having n tones whose frequencies and amplitudes are known.

In this way, it is possible to determine, a priori, the frequencies at which the cross-modulation products can appear in the amplified test signal. By means of this information, it is possible to use amplifier model identity algorithms that are much simpler and of higher performance than those generally used.

Preferably, the test signal is made up of two sinewaves (n=2) having the same amplitude.

The invention also provides a system for digitally linearizing an amplifier having non-linearity, in which system the means for determining correction parameters comprise:

means for acquiring said amplified test signal in the form of samples in baseband;

means for defining a modelled amplifier, by computing parameters of a predetermined amplifier model on the basis of said samples of the amplified test signal; and means for computing said correction parameters on the basis of said modelled amplifier so that they make it possible to linearize said modelled amplifier.

BRIEF DESCRIPTION OF THE DRAWINGS

Other characteristics and advantages of the invention appear on reading the following description of a preferred embodiment of the invention given merely by way of non-limiting example, and with reference to the accompanying drawings, in which.

MORE DETAILED DESCRIPTION

The invention relates to a method and a system for digitally linearizing an amplifier.

Figure 1:
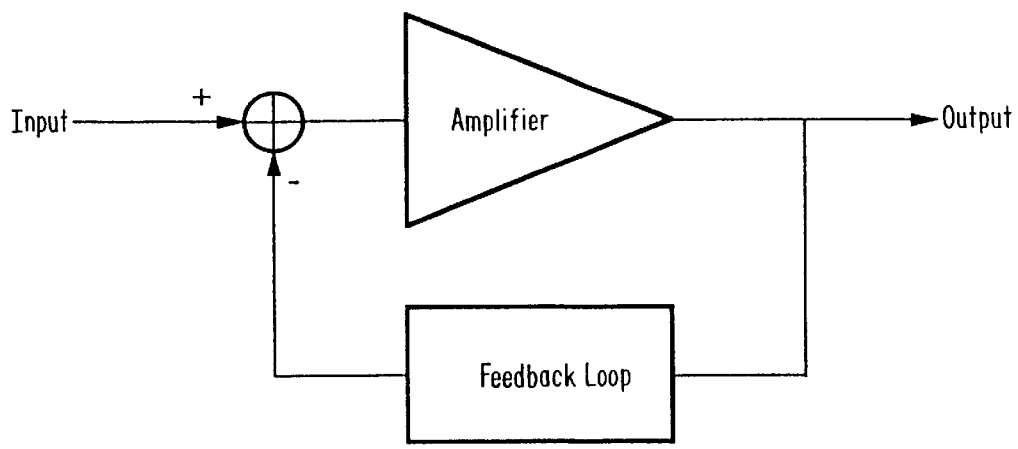
FIGS. 1 and 2 show respective known systems for linearizing amplifiers, the systems respectively including an analog feedback loop (FIG. 1) and an analog feedforward loop (FIG. 2)
Figure 2:
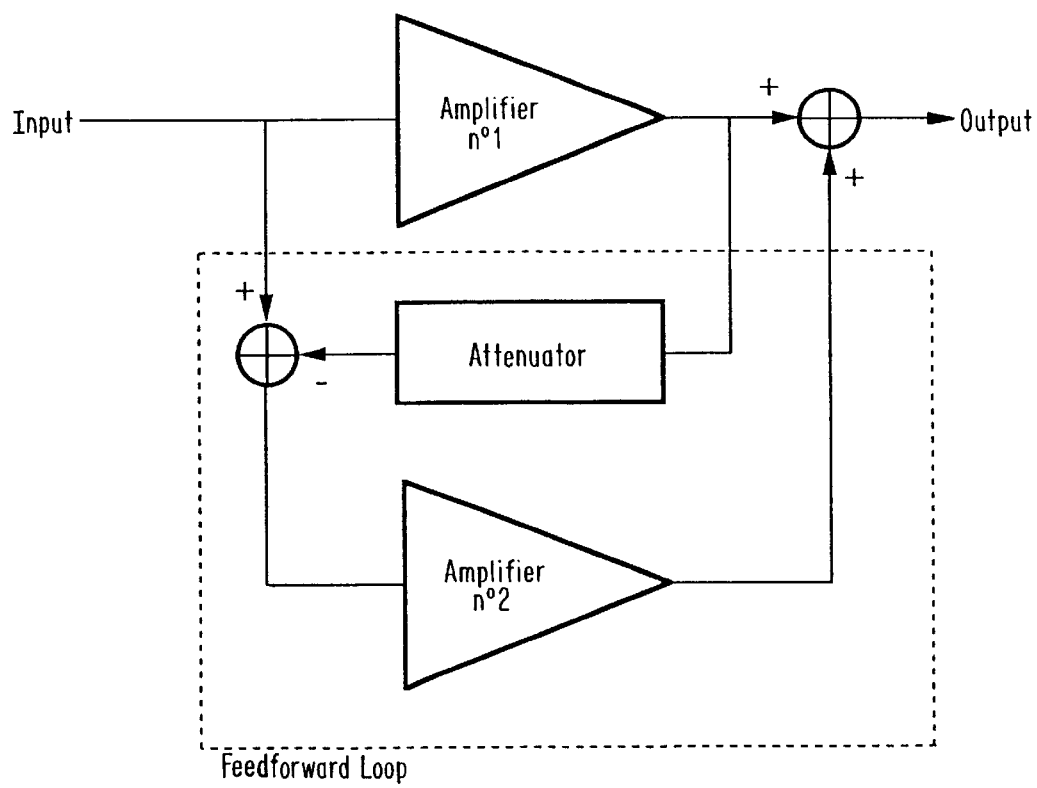
Figure 3:
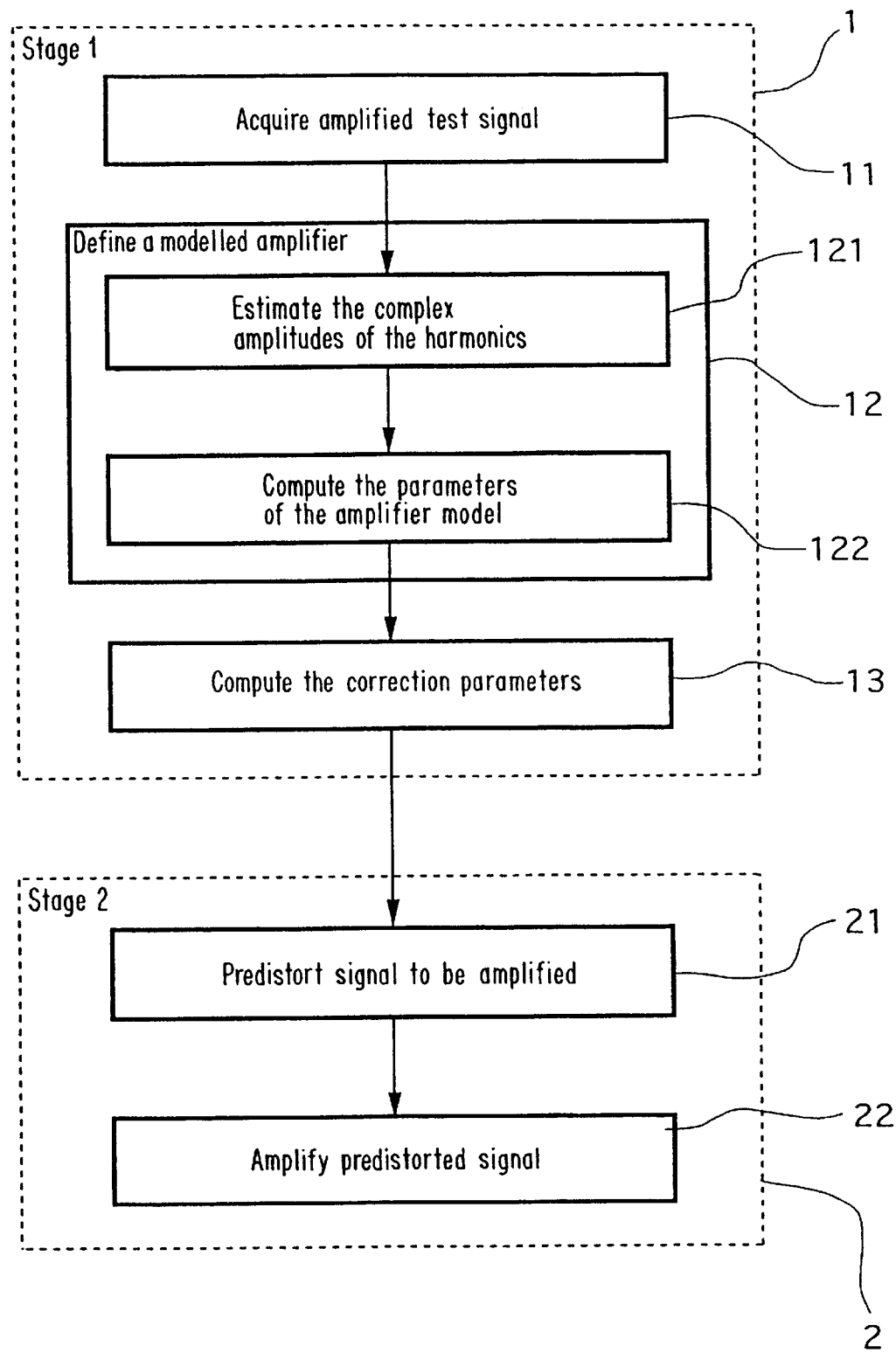
FIG. 3 is a simplified flow chart of a particular implementation of the method of the invention for digitally linearizing an amplifier.

As shown in the flow chart of FIG. 3, the linearization method of the invention is of the type comprising two successive stages 1 and 2.

The purpose of the first stage 1 is to determine correction parameters for correcting the non-linearity of the amplifier. It is recalled that the correction defined by said parameters, which correction is intended to be used during the second stage 2 described in detail below, is predistortion having non-linearity that is the inverse of the non-linearity of the amplifier. The correction parameters are determined by applying a predetermined test signal to the input of the amplifier and by analyzing the signal obtained at the output (this signal being referred to as the "amplified test signal"). At the end of this first stage 1, the correction parameters are stored, e.g. in a "predistortion" table.

The purpose of the second stage 2 is to amplify a given signal linearly. It comprises the following two steps: a predistortion step 21 in which the signal to be amplified is predistorted as a function of the previously determined correction parameters so as to obtain a predistorted signal; and an amplification step 22 in which the predistorted signal is amplified by the amplifier. If the predistortion is well matched, the signal present at the output of the amplifier corresponds to the input signal as amplified linearly.

The present invention relates more precisely to a novel way of performing the first stage 1, in which correction parameters are determined for correcting the non-linearity of the amplifier.

In the invention, the first stage 1 comprises the following steps:

acquiring (11) the amplified test signal in the form of samples in baseband;

defining (12) a modelled amplifier, by computing parameters of a predetermined amplifier model on the basis of the samples of the amplified test signal; and computing (13) correction parameters on the basis of the modelled amplifier so that they make it possible to linearize the modelled amplifier.

In the particular implementation described below, the step 12 in which the modelled amplifier is defined comprises the following steps:

estimating (121) the complex amplitudes of a predetermined number of harmonics at known frequencies; these harmonics are generated by the test signal applied to the input passing through the non-linearity of the amplifier; this estimation is performed by analyzing the spectra of the samples of the amplified test signal; and computing (122) the parameters of the predetermined amplifier model by identifying firstly the estimated complex amplitudes and secondly mathematical expressions corresponding to complex amplitudes of harmonics at the known frequencies for a signal present at the output of the modelled amplifier. The mathematical expressions are computed on the basis of the predetermined amplifier model, by assuming that the test signal is applied to the input thereof.

A description follows of a particular implementation of the step 11 in which the amplified test signal is acquired (in the form of samples in baseband).

It is assumed that the test signal applied to the input of the amplifier is a two-tone signal that may be written as follows:

$$e_n = A_1 \cdot e^{j(2\pi f_1 nT + \theta_1)} + A_2 \cdot e^{j(2\pi f_2 nT + \theta_2)}$$

For reasons of simplification, the following are chosen:

$A_1=A_2=1$, which means that the two sinewaves have the same amplitude; and $\theta_1=\theta_2=0$, which means that a good origin is taken for the times.

At the output of the amplifier, because of the non-linearity thereof, the amplified test signal has different harmonics. The amplified test signal is shifted to baseband (or to an intermediate frequency that is low enough), and is then filtered to remove the high-order harmonics. After filtering, only cross-modulation products of odd orders (orders 3, 5, 7, 9, . . . ) remain. This gives a sum of sinewaves at the frequencies $f_1$, $f_2$, $2*f_1-f_2$, $2*f_2-f_1$, $3*f_1-2*f_2$, $3*f_2-2*f_1$, $4*f_2-3f_1$, $4*f_1-3*f_2$, etc. The filtered signal is then sampled before passing through analog-to- digital converters.

Ultimately, the amplified test signal is represented in the form of digital samples in baseband.

A description follows of a particular implementation of the estimation step 121 in which the complex amplitudes of certain harmonics are estimated. In this particular implementation, parametric spectrum analysis is performed on the samples of the amplified test signal, e.g. using an Auto-Regressive (AR) technique or an Auto-Regressive Moving Average (ARMA) technique.

In addition, a predetermined signal model is used that is derived from the Prony model and is such that the $n^{th}$ sample of the amplified test signal can be estimated by:

$$\hat{s}_n = \sum_{i=1}^{i=p} H_i \tilde{~} e^{j(2\pi f_i n T)} + e_n$$

where:
- p is the number of harmonics in question;
- $f_i$ is the frequency of $i^{th}$ harmonic in question;
- $H_i$ is the complex amplitude of the $i^{th}$ harmonic in question;
- T is the sampling period; and
- $e_n$ is the noise, e.g. the quantification noise of the analog-to-digital converters, affecting the sample $s_n$.

For example, if the harmonics generated up to the fifth order are to be estimated, it is necessary to take p=6. The following complex amplitudes are then sought: $H_1$, $H_2$, $H_3$, $H_4$, $H_5$, and $H_6$. The associated frequencies $f_i$ are as follows: $f_1$, $f_2$, $2*f_1-f_2$, $2*f_2-f_1$, $3*f_1-2*f_2$, $3*f_2-2*f_1$.

As explained below, the complex amplitudes $H_i$ of the harmonics make it possible to construct the modelled amplifier (i.e. to determine the parameters thereof) and thus the predistortion table. These amplitudes characterize the AM-AM and AM-PM distortion of the amplifier.

If $S=[s_0\ s_1\ \ldots\ s_N]^T$ is the vector of the samples acquired during the acquisition step 11 in which the amplified test signal is acquired, and $\hat{S}=[\hat{s}_0\ \hat{s}_1\ \ldots\ \hat{s}_N]^T$ is the vector of the samples estimated using the above-mentioned signal model, and by minimizing (e.g. using the least squares method) the distance $\|S-\hat{S}\|$, it can be shown that:

$$H = M\ S$$

where
- $H=[H_1 H_2 \ldots H_p]^T$ is the vector of the complex amplitudes of the p harmonics in question;
- $S=[s_0\ s_1\ \ldots\ s_N]^T$ is the vector of the N samples of the amplified test signal taken into account for computing the complex amplitudes of harmonics. The number N depends on the duration of the sampling window and on the over-sampling factor. For example, with a window of 1 ms, and a factor of 2, N=36 (for a symbol rate of 18 kHz); and M is a predetermined matrix (p,N) that can be written: $M=([Z^H Z]^{-1} Z^H)$, where $z_i=\exp(2j\pi f_i)$, $Z^H$ is the Hermitian transpose of Z, and $$Z = \begin{bmatrix} 1 & 1 & \cdots & 1 \\ z_1 & z_2 & \cdots & z_p \\ \vdots & \vdots & \cdots & \vdots \\ z_1^{N-1} & z_2^{N-1} & \cdots & z_p^{N-1} \end{bmatrix}$$

A description follows of a particular implementation of the step 122 in which the parameters of the predetermined amplifier model are computed.

For example, the predetermined amplifier model may be a polynomial model of odd order (5, 7, or even 9, depending on the desired degree of accuracy) which can be written in the following form (e.g. by going up to the $7^{th}$ order):

$$y(t)=a_1*x(t-\tau_1)+a_3*x(t-\tau_3)^3+a_5*x(t-\tau_5)^5+a^7*x(t-\tau_7)^7 \quad (1)$$

where x(t) and y(t) are respectively the input signal and the output signal. The coefficients $a_i$ and the delays $\tau_i$ are the parameters of the predetermined amplifier model. This model therefore does not take into account the terms of even order because such terms generate no harmonic in the band of the Radio Frequency (RF) signal.

The modulated signal x(t) may be written as follows, as a function of its in-phase component $x_i$ and of its quadrature component $x_q$, and with $\omega=2\pi ft$, where f is the frequency of the carrier:

$$x(t)=x_i* \cos(\omega t)-x_q* \sin(\omega t) \quad (2)$$

Similarly, the signal y(t) at the output of the amplifier may be written as follows, as a function of its in-phase component $y_i$ and of its quadrature component $y_q$:

$$y(t)=y_i* \cos(\omega t)-y_q* \sin(\omega t) \quad (3)$$

By replacing x(t) in (1) by its expression obtained in (2), the following is obtained after computation:

$$y(t)=x_i*Re\ [e^{j\omega t}*G_a]-x_q*Im[e^{j\omega t}*G_a] \quad (4)$$

where:

$$\tilde{G_a} = a_1 \cdot e^{-j\omega\tau}1+(3/4)\cdot a_3 \cdot e^{-j\omega\tau}3 \cdot (x_i^2+x_q^2)+$$
$$(5/8)\cdot a_5 \cdot e^{-j\omega\tau}5 \cdot (x_i^2+x_q^2)^2+(35/64)\cdot a_7 \cdot e^{-j\omega\tau}7 \cdot (x_i^2+x_q^2)^3 \quad (5)$$

i.e.:

$$\tilde{G_a} = a_1+(3/4)\cdot a_3*(P_x)+(5/8)\cdot a_5*(P_x)^2+(35/64)\cdot a_7*(P_x)^3 \quad (5)$$

by writing:

$$\tilde{a_1} = a_i \cdot e^{-j\omega\tau}1$$

and:

$$P_x=x^2_i+x^2_q$$

By combining (3) and (4), and by writing:

$$G\ _a=G_{a\_i}+j*G_{a\_q}$$

the following are obtained:

$$y_i=x_i*G_{a\_i}-x_q*G_{a\_q}$$

and $$y_q = x_i^* G_{a\_q} - x_q^* G_{a\_i}$$

which can also be written:

$$\tilde{y} = \tilde{x} *G_a \quad (6)$$

where: $x = x_i + j^* x_q$ and $y = y_i + j^* y_q$

This is the baseband representation of the RF polynomial modelling (1) of the amplifier. It can be noted that the phase and amplitude distortions of the amplifier depend only on the instantaneous power $P_x$ of the input signal. This fact is used to construct the predistortion table, as explained below.

For greater clarity, and if necessary, we replace $$G_a = G_{a\_i} + j^* G_{a\_q} \text{ with } G_a(P_x) = G_{a\_i}(P_x) + j^* G_{a\_q}(P_x).$$

The amplitude and phase distortions of the amplifier can be written as follows in baseband:

amplitude distortion (AM-AM): $p_y = p_x^* |G_a(P_x)|^2$; and phase distortion (AM-PM):

$$\arg(y) = \arg(x) + \arg(G_a(P_x))$$

To "construct" the modelled amplifier, it is necessary to determine the values of the parameters $a_i$ and $\tau_i$. For this purpose, as explained above, a two-tone test signal is caused to pass through the non-linear amplifier. Thus:

$$x_{test}(t) = A_1 \cos(\omega_1 t + \theta_1) + A_2 \cos(\omega_2 t + \theta_2) \quad (7)$$

To keep the model simple, let: $A_1 = A_2 = 1$, and $\theta_1 = \theta_2 = 0$, as indicated above.

In the expression (1), by replacing $x(t)$ with $x_{test}(t)$ as defined in the expression (7), and:

by taking account of the fact that:

$$\omega_i^* \tau_i \approx \omega_2^* \tau_i \approx \omega^* \tau_i;$$

by assuming that:

$$\omega_1 = \omega - \Delta\omega \text{ and } \omega_2 = \omega + \Delta\omega, \text{ where } \Delta\omega << \omega;$$

by noting that, for conventional amplifiers, the $\tau_k$ values are of the order of one nanosecond, and, as far as possible, $\Delta\omega$ is chosen such that $\Delta\omega \cdot \tau_k << 1$; and by removing the harmonics which are not in the working band, the following is obtained after computation:

$$y(t)_{filtered} = \mathrm{Re}[\tilde{H_1} * (e^{j\omega_1 t} + e^{j\omega_2 t})] + \quad (8)$$
$$\mathrm{Re}[\tilde{H_3} * (e^{j(2\omega_2 - \omega_1)t} + e^{j(2\omega_1 - \omega_2)t})] +$$
$$\mathrm{Re}[\tilde{H_5} * (e^{j(3\omega_2 - 2\omega_1)t} + e^{j(3\omega_1 - 2\omega_2)t})] +$$
$$\mathrm{Re}[\tilde{H_7} * (e^{j(4\omega_2 - 3\omega_1)t} + e^{j(4\omega_1 - 3\omega_2)t})]$$

where:

$$\tilde{H_1} = a_1 + (9/4)a_3 + (25/4)a_5 + (1225/64)a_7 \quad (9)$$

$$H_3 = (3/4)a_3 + (25/8)a_5 + (735/64)a_7 \quad (10)$$

$$H_5 = (5/8)a_5 + (245/64)a_7 \quad (11)$$

$$H_7 = (35/64)a_7 \quad (12)$$

The complex amplitudes $H_i$ are estimated previously, during the step 121. It is thus possible, by inverting the system formed by the equations (9) to (12), to find the coefficients $a_i$ and $\tau_i$, i.e. the parameters of the modelled amplifier. Hence:

$$a_1 = (H_1 - 3^* H_3 + 5^* H_5 - 7^* H_7) \quad (13)$$

$$a_3 = (4/3)(H_3 - 5^* H_5 + 14^* H_7) \quad (14)$$

$$a_5 = (8/5)(H_5 - 7^* H_7) \quad (15)$$

$$a_7 = (64/35)(H_7) \quad (16)$$

Thus, the modelled amplifier is well defined in baseband. It is then used to construct the predistortion table.

A description follows of a particular implementation of the step 13 in which the correction parameters are computed.

The signal $y\_{linear}$ that is desired at the output, and that would be obtained if the amplifier were linear may be written as follows:

$$\tilde{y}\_{linear} = K^* \tilde{x} \quad (17)$$

where K is the ideal gain of the amplifier, and x is the baseband modulated signal at the input of the amplifier.

It should be noted that the gain K of the amplifier is constant: it does not therefore depend on the instantaneous power of the signal x at the input of the amplifier. For reasons of simplicity, the gain K is assumed to be real (no phase shift between the input and the output of the amplifier that is to be linearized).

A signal $z = z_i + j^* z_q$ is sought that is to be applied in place of x to the input of the non-linear amplifier, and that enables $y\_{linear}$ to be obtained at the output. In other words, the signal z is sought that corresponds to the predistorted signal x, such that:

$$\tilde{z} *G_a(P_z) = \tilde{y}\_{linear} = K^* \tilde{x} \quad (18)$$

where $P_z = z_i^2 + z_q^2$

It is not possible to invert the relationship (18) directly, i.e; to compute z on the basis of x. However, it is easy to deduce from (18) that:

if $P_z$ is known, then z is fully determined:

$$\tilde{z} = (K/G_a(P_z))^* \tilde{x} \quad (19)$$

the choice of $P_z$ depends on $P_x$ only; on the basis of (18):

$$P_z^* |G_a(P_z)|^2 = K^{2*} P_x \quad (20)$$

This relationship is the only condition on $P_z$.

To compute z on the basis of x, the following are then performed:

the instantaneous power $P_x$ of the signal x is computed: $P_x = x_i^2 + x_q^2$;

$P_z$ is determined, satisfying (20); and z is then computed by means of (19):

$$\tilde{z} = G_p(P_x)^* \tilde{x} \quad (21)$$

where:

$$G_p(P_x) = K/G_a(P_z) \quad (22)$$

The contents of a predistortion table including the correction parameters follow naturally from the above. The input of the table is $P_x$ and it outputs the value $G_p(P_x)$, which appears as a "complex predistortion gain" on the basis of (21). The value of the predistorted signal is obtained by applying the complex gain $G_p(P_x)$ to x.

Figure 4:
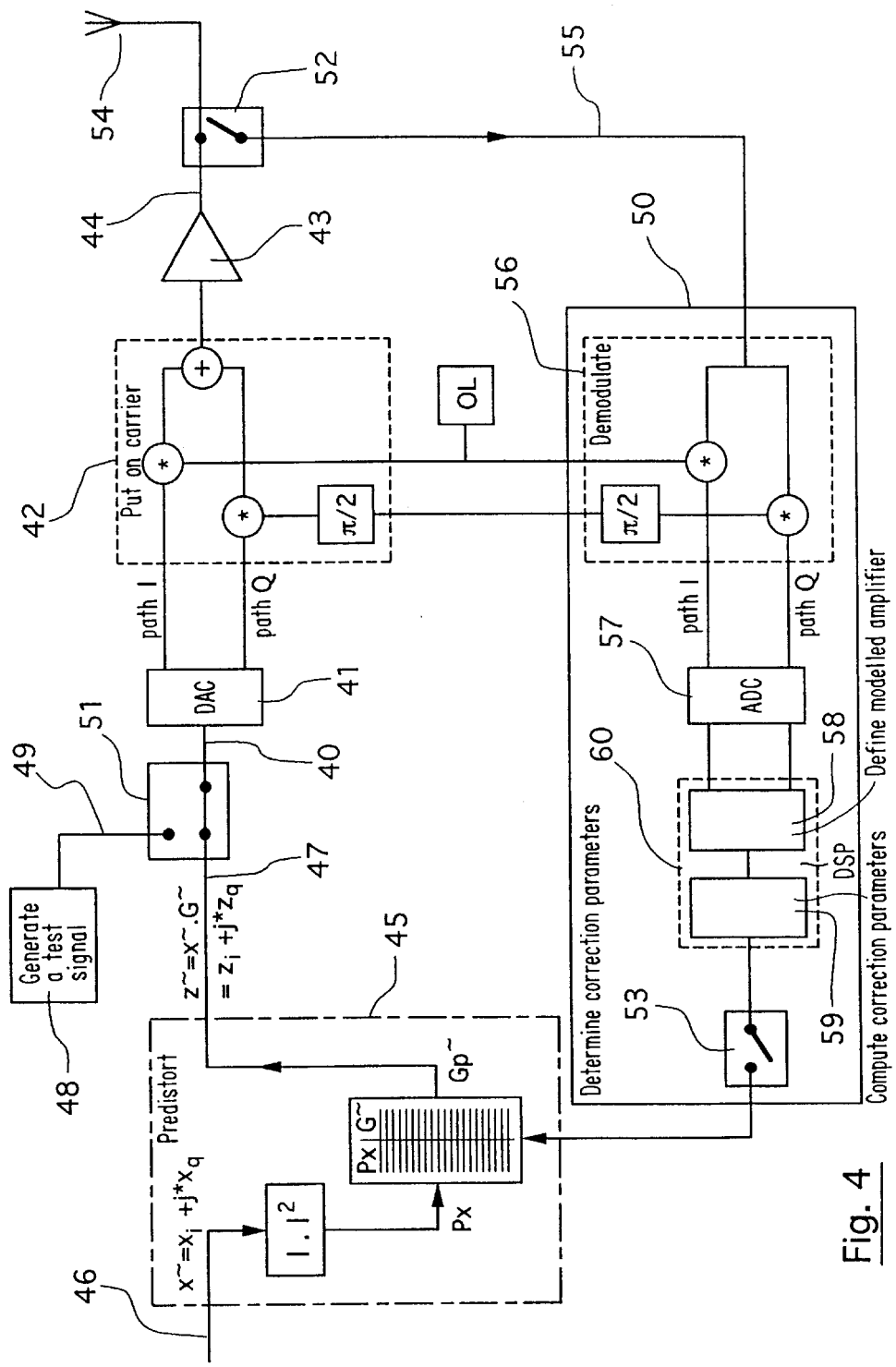
FIG. 4 is a simplified diagram showing a particular embodiment of the system of the invention for digitally linearizing an amplifier implementing the method shown in FIG. 3.

The invention also relates to a system of digitally linearizing an amplifier. A particular embodiment of the system is described below with reference to FIG. 4.

The system comprises:

a digital-to-analog converter 41 receiving either a predistorted signal 47 or a test signal 49, depending on the operating mode of the system (as explained below);

means 42 for putting the signal on a carrier, on two paths I and Q in quadrature, the means being placed downstream from the digital-to-analog converter 41;

an amplifier 43 placed downstream from the means 42 for putting the signal on a carrier, which amplifier delivers an amplified signal 44; it is recalled that the amplifier 43 has non-linearity that is to be compensated by predistortion;

predistortion means 45 receiving a digital signal to be amplified 46 and delivering a predistorted signal 47 (to be applied to the digital-to-analog converter 41);

means 48 for generating a test signal 49 to be applied to the digital-to-analog converter 41;

means 50 for determining the correction parameters used by the predistortion means 45;

first switch means 51 making it possible to apply either the predistorted signal 47 or the test signal 49 to the input of the digital-to-analog converter 41;

optional second switch means 52 making it possible to direct the amplified signal 44 either to the output of the system (corresponding, for example, to an antenna 54) or to the means 50 for determining the correction parameters; and third switch means 53 making it possible to make or break a connection between the predistortion means 45 and the means 50 for determining the correction parameters.

The system has two operating modes corresponding to respective ones of the two stages 1, 2 of the method described above with reference to FIG. 3, namely:

an "acquisition" mode, in which the digital-to-analog converter 41 receives the test 49, and the means 50 for determining the correction parameters receive the amplified signal 44 (which is then the amplified test signal 55), and are connected to the predistortion means 45 (which they inform of the new correction parameters; and an "amplification" mode in which the digital-to-analog converter 41 receives the predistorted signal 47, and the amplified signal 44 is transmitted to the antenna 54.

In a particular embodiment of the invention, the means 50 for determining the correction parameters comprise:

demodulation means 56 for demodulating the amplified test signal 55;

an analog-to-digital converter 57 placed downstream from the demodulation means 56;

means 58 for defining a modelled amplifier; and means 59 for computing correction parameters on the basis of the modelled amplifier; in other words these are means for constructing the predistortion table used by the predistortion means 45 in amplification mode.

The definition means 58 and the computation means 59 are, for example, contained in a digital signal processor (DSP) 60. They and the predistortion means 45 operate in a manner corresponding to implementation of the steps bearing the same respective names, as described above with reference to FIG. 3. The manner in which they operate is therefore not described again.

What is claimed is:

1. A method of digitally linearizing an amplifier having non-linearity, the method comprising the steps of:

determining correction parameters for correcting said non-linearity based on an amplified test signal output from the amplifier when a test signal is applied to the input of the amplifier, wherein said test signal is a signal having n tones whose frequencies and amplitudes are known, the step of determining the correction parameters comprising:

acquiring said amplified test signal in the form of samples in baseband;

defining a modelled amplifier, by computing parameters of a predetermined amplifier model on the basis of said samples of the amplified test signal; and computing said correction parameters on the basis of said modelled amplifier so that said correction parameters linearize said modelled amplifier;

predistorting an input signal which is to be amplified by said amplifier based on said correction parameters so as to obtain a predistorted signal; and amplifying said predistorted signal using said amplifier so that the amplified predistorted signal output by said amplifier corresponds to said input signal as amplified linearly.

2. A method of digitally linearizing an amplifier having non-linearity, the method comprising:

determining correction parameters for correcting said non-linearity based on an amplified test signal output from the amplifier when a test signal is applied to the input of the amplifier, the step of determining said correction parameters comprising:

acquiring said amplified test signal in the form of samples in baseband;

defining a modelled amplifier, by computing parameters of a predetermined amplifier model on the basis of said samples of the amplified test signal; and computing said correction parameters on the basis of said modelled amplifier so that said correction parameters linearize said modelled amplifier, wherein said test signal is a signal having n tones whose frequencies and amplitudes are known;

predistorting an input signal which is to be amplified by said amplifier based on said correction parameters so as to obtain a predistorted signal; and amplifying said predistorted signal using said amplifier so that the amplified predistorted signal output by said amplifier corresponds to said input signal as amplified linearly, wherein said step of defining the modeled amplifier comprises:

estimating complex amplitudes of a predetermined number of harmonics at predetermined frequencies by performing spectrum analysis on the samples of said amplified test signal, said harmonics being generated by said non-linearity of the amplifier; and computing the parameters of the predetermined amplifier model by identifying the estimated complex amplitudes and mathematical expressions corresponding to complex amplitudes of harmonics at said known frequencies for a signal present at the output of the modelled amplifier, said mathematical expressions being computed on the basis of said predetermined amplifier model, by assuming that the test signal is applied to the input thereof.

3. The method according to claim 2, wherein said spectrum analysis comprises parametric spectrum analyses, or spectrum analyses by sampling followed by a Fourier transform.

4. The method according to claim 3, wherein said step of estimating the complex amplitudes of harmonics comprises computing:

$$H = M\,S$$

where
- $H=[H_1 H_2 \ldots H_p]^T$ is the vector of the complex amplitudes of p harmonics in question;
- $S=[s_0\ s_1\ \ldots\ s_N]^T$ is the vector of N samples of the amplified test signal; and
- M is a predetermined matrix.

5. The method according to claim 4, wherein said matrix $M=([Z^H Z]^{-1} Z^H)$ where
- $Z^H$ is the Hermitian transpose of Z;
- $Z_i = \exp(2j\pi f_i)$, $f_i$ being the frequency of the $i^{th}$ harmonic in question; and $$Z = \begin{bmatrix} 1 & 1 & \cdots & 1 \\ z_1 & z_2 & \cdots & z_p \\ \vdots & \vdots & \cdots & \vdots \\ z_1^{N-1} & z_2^{N-1} & \cdots & z_p^{N-1} \end{bmatrix}.$$

6. A method of digitally linearizing an amplifier having non-linearity, the method comprising:
- determining correction parameters, for correcting said non-linearity based on an amplified test signal output from the amplifier when a test signal is applied to the input of the amplifier, the step of determining said correction parameters comprising:
  - acquiring said amplified test signal in the form of samples in baseband;
  - defining a modelled amplifier, by computing parameters of a predetermined amplifier model on the basis of said samples of the amplified test signal, wherein said predetermined amplifier model is a polynomial model; and
  - computing said correction parameters on the basis of said modelled amplifier so that said correction parameters linearize said modelled amplifier, wherein said test signal is a signal having n tones whose frequencies and amplitudes are known;
- predistorting an input signal which is to be amplified by said amplifier based on said correction parameters so as to obtain a predistorted signal; and
- amplifying said predistorted signal using said amplifier so that the amplified predistorted signal output by said amplifier corresponds to said input signal as amplified linearly.

7. The method according to claim 6, wherein said polynomial model is of odd order and does not take account of the even-order terms.

8. The method according to claim 7, wherein said polynomial model is represented by $y = x^* G_a$ in baseband, where:
- the input $x = x_i + j^* x_q$
- the output $y = y_i + j^* y_q$
- $G_a(P_x) = a_1 + (3/4)\cdot a_3 \cdot (P_x) + (5/8)\cdot a_5 \cdot (P_x)^2 + (35/64)\cdot a_7 \cdot (P_x)^3 + \ldots$ where:
- $P_x = x_i^2 + x_q^2$
- $a_1 = a_i \cdot e^{-j\omega \tau_i}$
- $x_i$ and $x_q$ are respectively the in-phase component and the quadrature component of x;
- $y_i$ and $y_q$ are respectively the in-phase component and the quadrature component of y; and
- the coefficients $a_i$ and the associated delays $\tau_i$ are parameters of said predetermined amplifier model.

9. A system for digitally linearizing an amplifier having non-linearity, the system comprising:
- means for determining correction parameters for correcting said non-linearity based on an amplified test signal output by the amplifier when a test signal is applied to the input of the amplifier; and
- predistortion means for predistorting an input signal based on said correction parameters in order to generate a predistorted signal to be amplified by said amplifier so that the amplified predistorted signal output by said amplifier corresponds to said input signal as amplified linearly;
- wherein said means for determining correction parameters comprise:
  - means for acquiring said amplified test signal in the form of samples in baseband;
  - means for defining a modelled amplifier, by estimating complex amplitudes of a predetermined number of harmonics at predetermined frequencies by performing spectrum analysis on the samples of said amplified test signal, said harmonics being generated by said non-linearity of the amplifier; and computing the parameters of the predetermined amplifier model by identifying the estimated complex amplitudes and mathematical expressions corresponding to complex amplitudes of harmonics at said known frequencies for a signal present at the output of the modelled amplifier, said mathematical expressions being computed on the basis of said predetermined amplifier model, by assuming that the test signal is applied to the input thereof; and
  - means for computing said correction parameters on the basis of said modelled amplifier so that so that said correction parameters linearize said modelled amplifier.

10. A system for digitally linearizing an amplifier having non-linearity, the system comprising:
- means for determining correction parameters for correcting said non-linearity based on an amplified test signal present output by the amplifier when a test signal is applied to the input of the amplifier; and
- predistortion means for predistorting an input signal based on said correction parameters in order to generate a predistorted signal to be amplified by said amplifier so that the amplified predistorted signal output by said amplifier corresponds to said input signal as amplified linearly;
- wherein said means for determining correction parameters comprise:
  - means for acquiring said amplified test signal in the form of samples in baseband;
  - means for defining a modelled amplifier, by computing parameters of a predetermined amplifier model on the basis of said samples of the amplified test signal, wherein said predetermined amplifier model is a polynomial model; and
  - means for computing said correction parameters on the basis of said modelled amplifier so that so that said correction parameters linearize said modelled amplifier.

11. A system for digitally linearizing an amplifier having non-linearity, the system comprising:
- means for determining correction parameters for correcting said non-linearity based on an amplified test signal present output by the amplifier when a test signal is applied to the input of the amplifier, wherein said test signal is a signal having a plurality of tones whose frequencies and amplitudes are known; and predistortion means for predistorting an input signal based on said correction parameters in order to generate a predistorted signal to be amplified by said amplifier so that the amplified predistorted signal output by said amplifier corresponds to said input signal as amplified linearly;

wherein said means for determining correction parameters comprise:

means for acquiring said amplified test signal in the form of samples in baseband;

means for defining a modelled amplifier, by computing parameters of a predetermined amplifier model on the basis of said samples of the amplified test signal; and means for computing said correction parameters on the basis of said modelled amplifier so that so that said correction parameters linearize said modelled amplifier.

* * * * *